United States Patent [19]
Hoshi et al.

[11] Patent Number: 5,129,827
[45] Date of Patent: Jul. 14, 1992

[54] METHOD FOR BONDING SEMICONDUCTOR SUBSTRATES

[75] Inventors: Tadahide Hoshi, Yokohama; Kiyoshi Yoshikawa, Kawasaki, both of Japan

[73] Assignee: Kabushiki Kaisha Toshiba, Kawasaki, Japan

[21] Appl. No.: 571,980

[22] Filed: Aug. 24, 1990

[30]  Foreign Application Priority Data

Aug. 28, 1989 [JP]  Japan .................................. 1-221337

[51] Int. Cl.⁵ ............................................ H01L 21/76
[52] U.S. Cl. ..................... 437/62; 29/25.02;
148/DIG. 12; 437/86
[58] Field of Search ................. 148/DIG. 12; 437/62, 437/86, 974, 31, 976; 29/25.02

[56]  References Cited

U.S. PATENT DOCUMENTS

| | | | |
|---|---|---|---|
| 3,417,459 | 12/1968 | Pomerantz et al. | 148/DIG. 12 |
| 4,752,180 | 6/1988 | Yoshikawa | 414/737 |
| 4,830,984 | 5/1989 | Purdes | 148/DIG. 97 |
| 4,939,101 | 7/1990 | Black et al. | 148/DIG. 72 |

FOREIGN PATENT DOCUMENTS 60-236210 11/1985 Japan .
62-158905 6/1987 Japan .
62-333867 12/1987 Japan .

OTHER PUBLICATIONS

Japanese Patent Disclosure (Kokai) No. 62-71215 (No English Translation).
Wolf et al., "Silicon Processing for the VLSI Era", Lattia Press, Sunset Beach, Calif., 1986, pp. 116-117.

Primary Examiner—Olik Chaudhuri
Assistant Examiner—Ken Horton
Attorney, Agent, or Firm—Finnegan, Henderson, Farabow, Garrett and Dunner

[57]  ABSTRACT

There is provided a method for bonding at least two semiconductor wafers to each other which comprises the steps of warping one of the semiconductor wafers, bringing the warped semiconductor wafer into contact with the other semiconductor wafer at one contact point, and reducing pressure in an atmosphere surrounding the semiconductor wafers to flatten the warped semiconductor wafer. An apparatus for bonding wafers using the above bonding method comprises a first wafer holder for warping and holding one of two wafers and a second wafer holder for holding the other wafer. First and second covers are attached so as to surround the first and second wafer holders. The apparatus further comprises a shaft for rotating the first and second wafer holders so that one of the wafers contact the other wafer at one contact point and the first and second covers are connected to each other to form a chamber. A vacuum pump for reducing pressure in the chamber is connected to the chamber through an exhaust hole provided at one of the first and second covers.

12 Claims, 14 Drawing Sheets

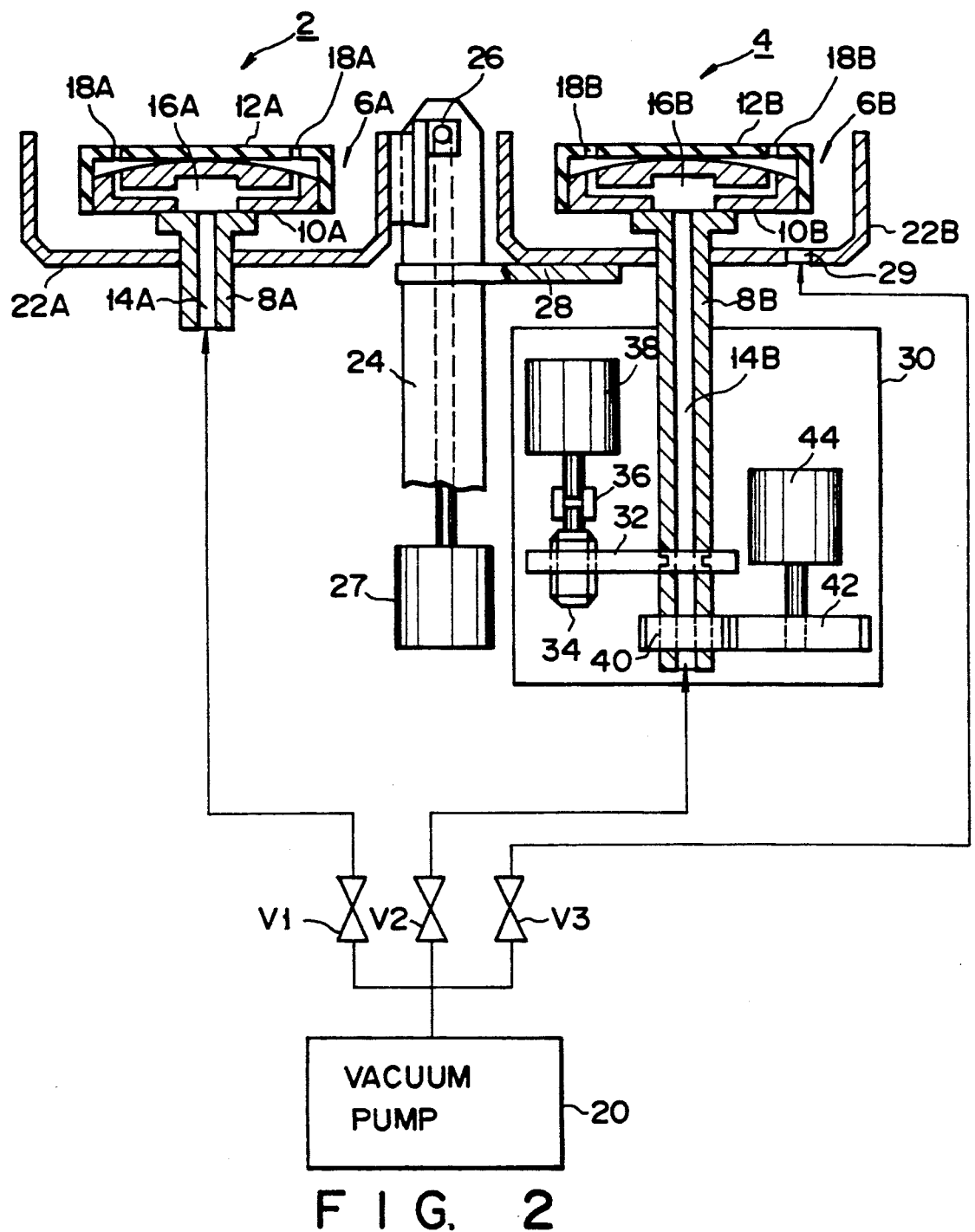
F I G. 2

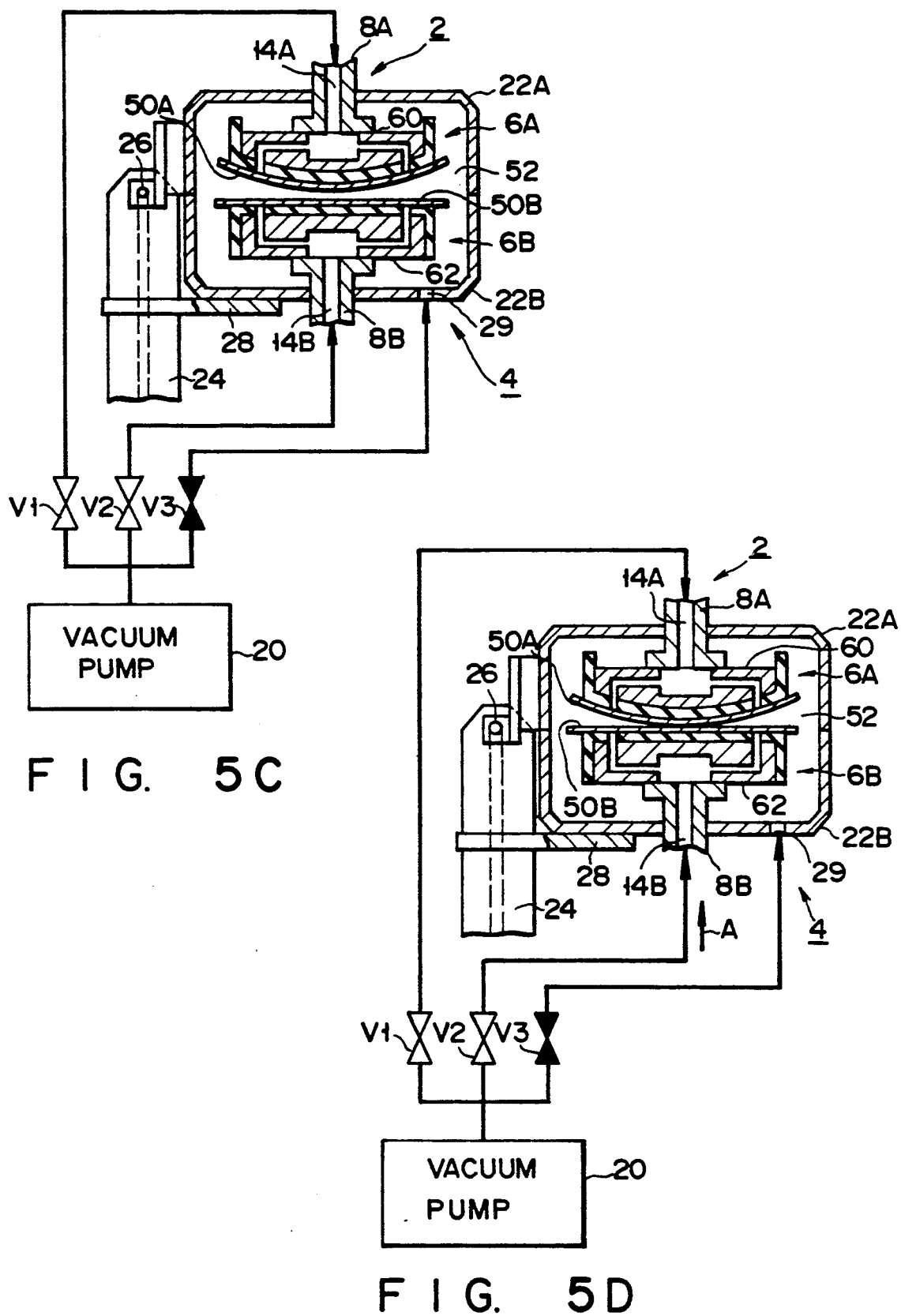
F I G. 5C
F I G. 5D

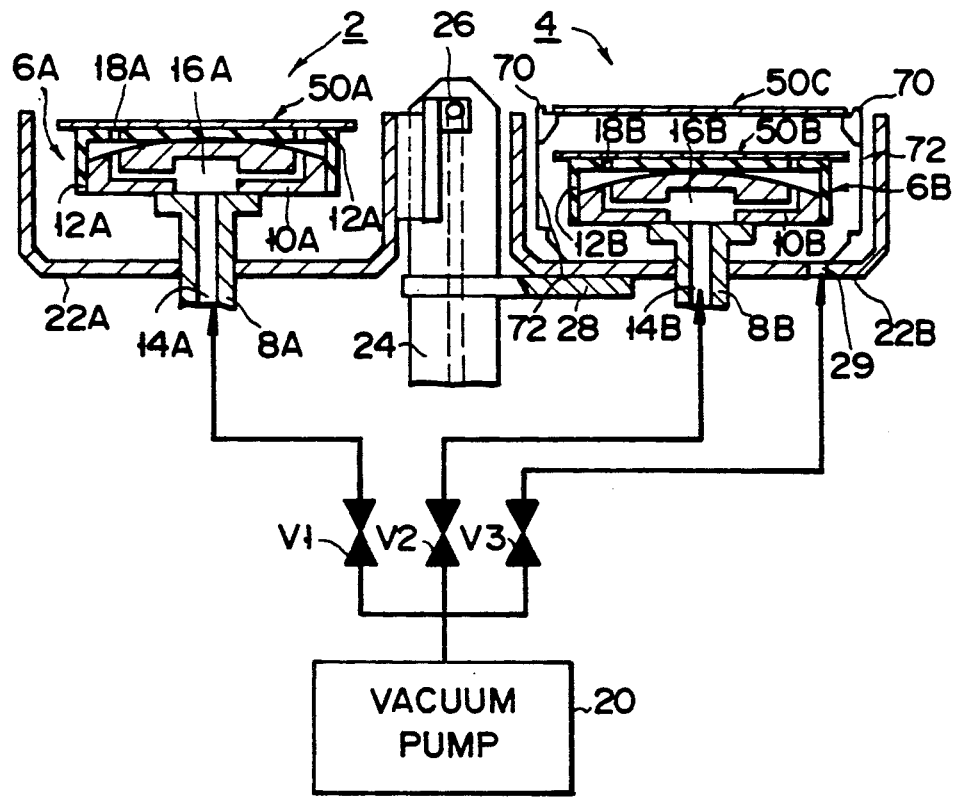
F I G. 7A
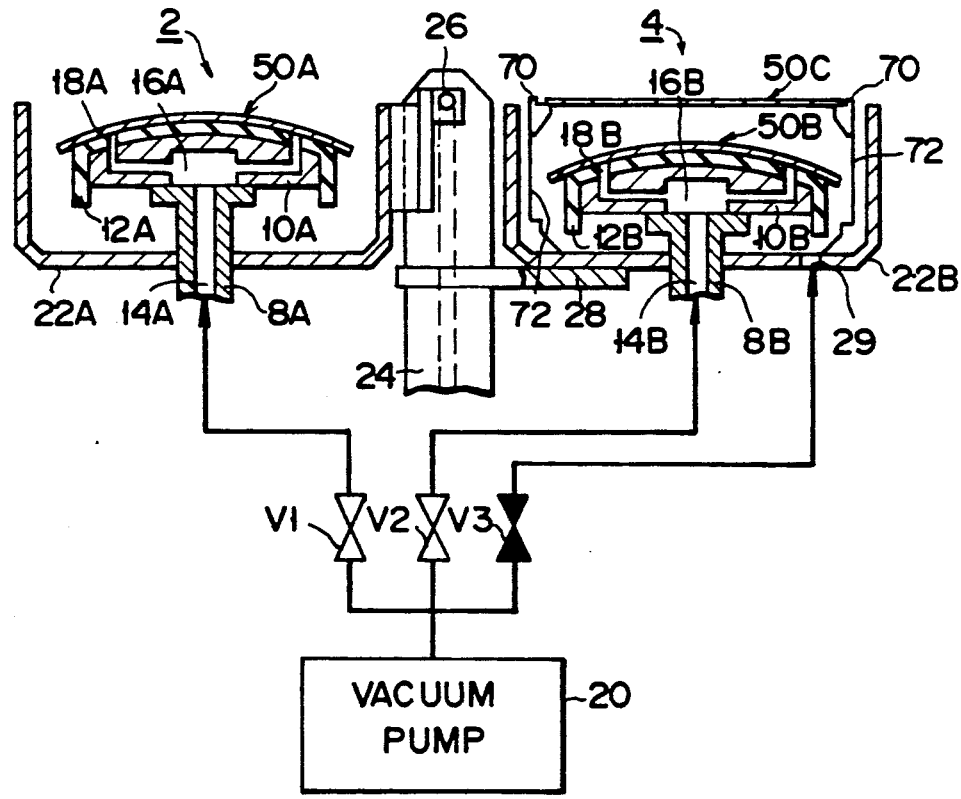
F I G. 7B

METHOD FOR BONDING SEMICONDUCTOR SUBSTRATES

BACKGROUND OF THE INVENTION

1. Field of the Invention

The present invention relates to a method for bonding semiconductor substrates and an apparatus therefor.

2. Description of the Related Art

Two semiconductor wafers, whose surfaces are mirror-ground, are placed opposite to each other and brought into contact with each other in a clean atmosphere. These semiconductor wafers are thus bonded together to form a substrate for forming a semiconductor element and the substrate is called a bonded wafer.

According to a method for bonding two wafers by bringing their mirror-ground surfaces into contact with each other, they can be bonded without using any adhesive and, therefore, a semiconductor element can be formed by subjecting the bonded wafers to the same high-temperature and chemical processings as those to which a single wafer is subjected.

Since, however, the wafers are bonded under the atmospheric pressure, sometimes air bubbles are left between the wafers.

A bonding apparatus which solves the problem of air bubbles formed by bonding the wafer under the atmospheric pressure is disclosed in U.S. Pat. No. 4,752,180. In this apparatus, one of the wafers is warped, making it difficult for air bubbles to be formed even in atmospheric pressure.

To warp one of the wafers, however, a support base must be formed having an elastic member. If the elastic member has ripples or waves, those ripples will affect the wafer. As illustrated in FIGS. 2A and 2B, slight waviness 112 occurs on one of two wafers constituting bonded wafer 110 and, thus, air bubbles 114 are formed between the wafers.

SUMMARY OF THE INVENTION

It is, accordingly, an object of the present invention to provide a method for bonding semiconductor substrates in which a solid bonded wafer can be manufactured without leaving air bubbles in the bonded wafer and an apparatus therefor in which a great number of bonded wafers can be manufactured in a short time using the bonding method.

To attain the above object, there is provided a method for bonding semiconductor substrates, comprising the steps of:

warping a flat first semiconductor substrate;

bringing the warped first semiconductor substrate into contact with a second semiconductor substrate at one contact point; and reducing pressure in an atmosphere surrounding the first and second semiconductor substrates to flatten the warped first semiconductor substrate.

Also, to attain the above object, there is provided an apparatus for bonding semiconductor substrates, comprising:

first holding means for holding a first semiconductor substrate;

second holding means for warping and holding a flat second semiconductor substrate;

first housing means for housing the first holding means;

second housing means for housing the second holding means, covering the first housing means, and bringing the second semiconductor substrate into contact with the first semiconductor substrate at one contact point; and pressure reducing means for reducing pressure in the first and second housing means, with the first housing means covered with the second housing means, to flatten the warped second semiconductor substrate.

According to the bonding method of the present invention, no air bubbles occur between the first and second semiconductor substrates; therefore, a solid bonded wafer can be formed.

According to the bonding apparatus of the present invention, a chamber for sealing only a region surrounding the first and second holding means is formed, and the pressure in this chamber can be reduced, thereby achieving the bonding method. Since the pressure in the chamber only needs to be reduced, the amount of the pressure can be decreased. It is therefore possible to shorten the time required for reduction in pressure and to produce a large number of bonded substrates in a short time using the above-described bonding method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a partially sectional view showing an apparatus for bonding semiconductor wafers according to the first embodiment of the present invention;

FIGS. 5A to 5F are cross-sectional views showing a process for bonding the wafers in the vicinity of wafer holders of the bonding apparatus shown in FIG. 4;

FIGS. 7A to 7F are cross-sectional views showing a process for bonding the wafers in the vicinity of wafer holders of the bonding apparatus shown in FIG. 6.

DETAILED DESCRIPTION OF THE PREFERRED EMBODIMENTS

Figure 1A:
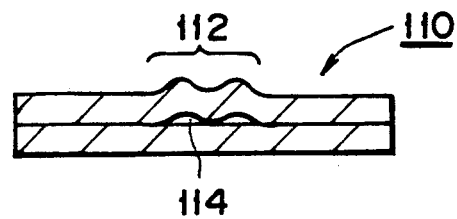
FIGS. 1A and 1B are views showing waviness caused in a bonded wafer formed by another bonding apparatus.
Figure 1B:
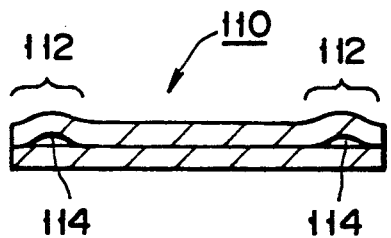

Embodiments of the present invention will be described with the accompanying drawings.

Embodiment 1

FIG. 2 is a partially sectional view showing an apparatus for bonding semiconductor wafers according to the first embodiment of the present invention.

As shown in FIG. 2, first support 2 comprises wafer holder 6A and support member 8A for supporting wafer holder 6A, and second support 4 comprises wafer holder 6B and support member 8B for supporting wafer holder 6B. Wafer holders 6A and 6B comprise projecting members 10A and 10B, respectively, each having a convex main surface, and support bases 12A and 12B formed so as to cover the main surfaces of projecting members 10A and 10B. Wafers are placed on support bases 12A and 12B.

Exhaust paths 14A and 14B are formed through support members 8A and 8B, respectively. One end of path 14A communicates with exhaust path 16A formed in projecting member 10A, and one end of path 14B communicates with exhaust path 16B formed in projecting member 10B. Paths 16A and 16B communicate with adhesion holes 18A and 18B formed in support bases 12A and 12B, respectively. The other ends of paths 14A and 14B are connected to vacuum pump 20, such as a booster rotary pump, through valves V1 and V2, respectively.

The wafers placed on support bases 12A and 12B are vacuum-chucked by paths connected from vacuum pump 20 to adhesion holes 18A and 18B through exhaust paths 14A and 14B and exhaust paths 16A and 16B and are fixed onto wafer holders 6A and 6B. Support bases 12A and 12B are made of elastomer and warped in accordance with the formation of the main surfaces of projecting members 10A and 10B at the same time when the wafers are vacuum-chucked. The wafers themselves can thus be warped.

Wafer holders 6A and 6B are surrounded by first and second covers 22A and 22B, respectively. First cover 22A is connected to shaft 26 of support column 24. Shaft 26 is connected to pulse motor 27 and rotated by the motor. First cover 22A can thus be rotated on shaft 26. On the other hand, second cover 22B is fixed to support column 24 by means of fixing member 28. First cover 22A, together with first support 2, rotates on shaft 26 and is connected to second cover 22B. First and second covers 22A and 22B form a chamber in which wafer holders 6A and 6B are housed.

Second cover 22B has exhaust hole 29 which is connected to vacuum pump 20 through valve V3. Second support 4 is connected to drive mechanism 30 to allow wafer holder to move in its vertical direction and rotate. In drive mechanism 30, one end of lift plate 32 is connected to support member 8B. Bolt 34 is engaged with the other end of lift plate 32 and connected through joint 36 to a rotation axis of pulse motor 38 for moving wafer holder 6B in the vertical direction. Wafer holder 6B can thus move up and down in the vertical direction. Gear 40 is attached to support member 8B and engaged with gear 42. Gear 42 is connected to pulse motor 44 to rotate wafer holder 6B.

A method for bonding wafers using the above-described bonding apparatus will be described with reference to FIGS. 3A to 3F. FIGS. 3A to 3F are cross-sectional views showing the vicinity of the wafer holders of the bonding apparatus shown in FIG. 2 in order of bonding process. In FIGS. 3A to 3F, the same components as those in FIG. 2 are denoted by the same reference numerals.

Figure 3A:
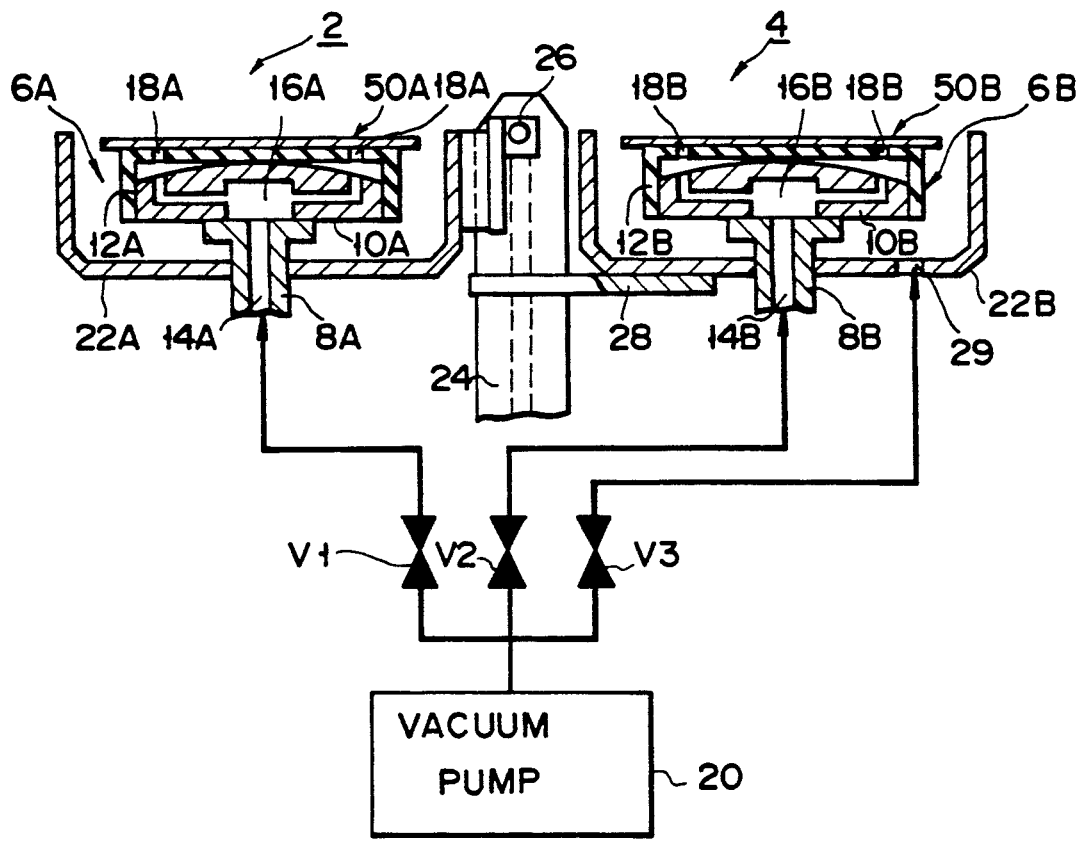
FIGS. 3A to 3F are cross-sectional views showing the vicinity of wafer holders of the bonding apparatus shown in FIG. 2 in order of bonding process.

As illustrated in FIG. 3A, semiconductor wafers 50A and 50B are placed on wafer holders 6A and 6B, respectively, in a sufficiently clean atmosphere and the valves V1 to V3 are closed as represented by the blackened symbols. Support bases 12A and 12B are flattened as are wafers 50A and 50B.

Figure 3B:
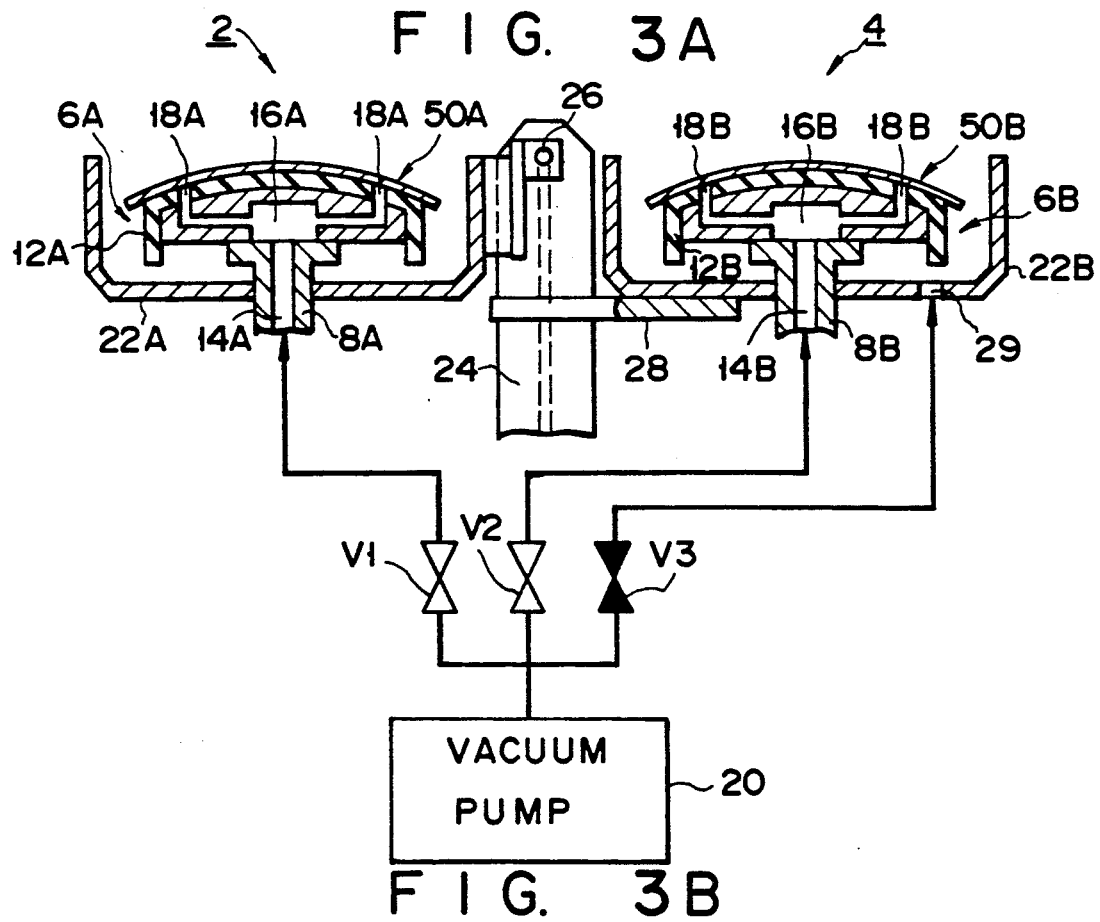

As illustrated in FIG. 3B, valves V1 and V2 are opened to reduce the pressure the exhaust paths to about 450 mmHg and vacuum-chuck wafers 50A and 50B. Support bases 12A and 12B are then warped in accordance with the form of the main surfaces of projecting members 10A and 10B and, therefore, wafers 50A and, 50B are warped in accordance with the form of the surfaces of support bases 12A and 12B.

Figure 3C:
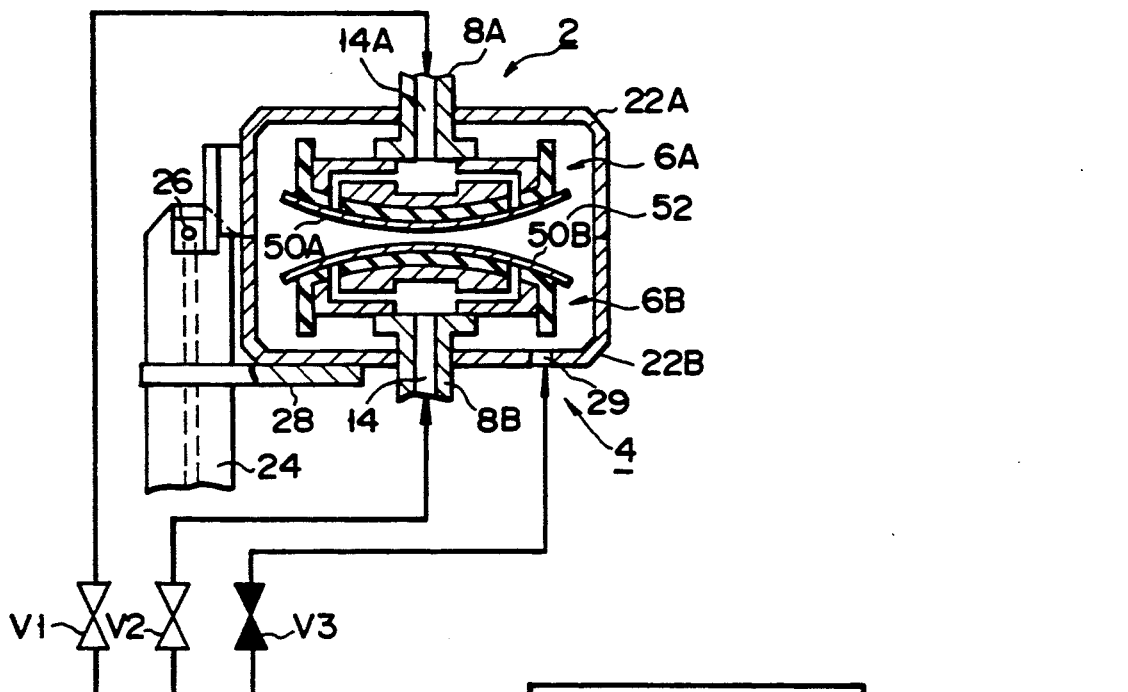

As shown in FIG. 3C, support 2 is folded down onto support 4. First covers 22A and 22B are then connected to each other to form closed chamber 52. Wafers 50A and 50B as well as wafer holders 6A and 6B are housed in chamber 52.

Figure 3D:
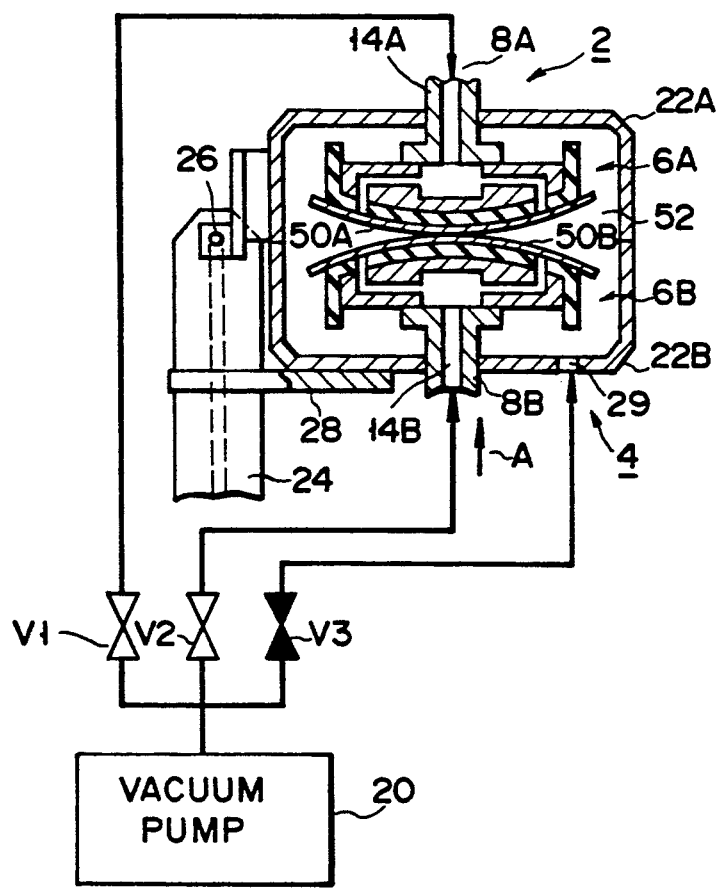

As shown in FIG. 3D, wafer holder 6B is raised by the drive mechanism in the direction of arrow A to bring wafers 50A and 50B into contact with each other. It is desirable that wafers 50A and 50B contact each other at their central portions.

Figure 3E:
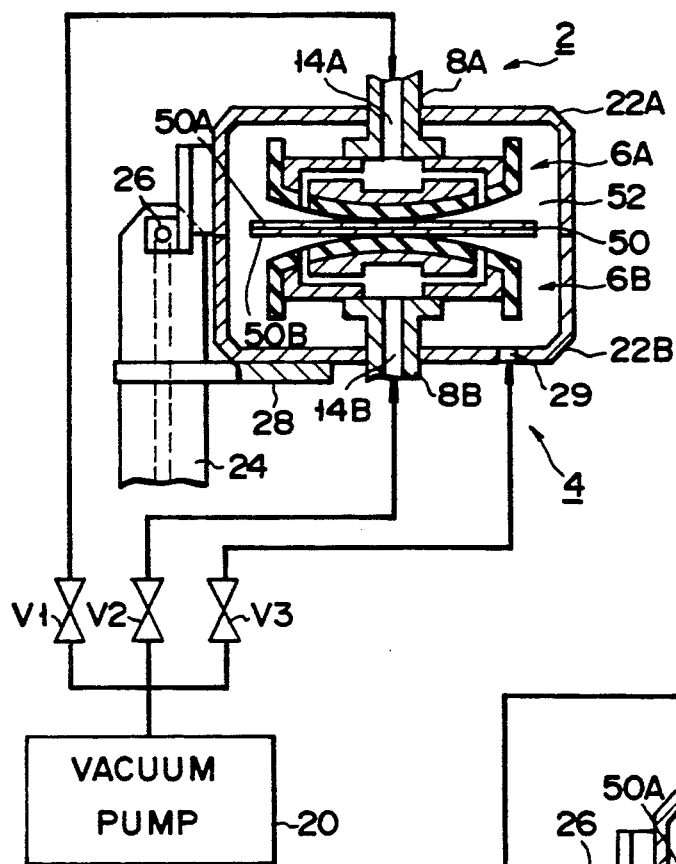

As shown in FIG. 3E, valve 3 is opened to reduce the pressure in chamber 52. If the pressure in chamber 52 becomes the same as or lower than the pressure (about 450 mmHg) in the exhaust paths, wafers 50A and 50B are freed from their adhesion and the wafers are flattened again. Thus wafers 50A and 50B contact together to form bonded wafer 50.

The surfaces of wafers 50A and 50B, which contact each other, are of course mirror-ground surfaces, and the wafers are bonded in a clean atmosphere. The atmosphere is very clean since the pressure in chamber 52 is reduced. Furthermore, a suitable thermal treatment can be carried out in order to form a harder bonded wafer.

Figure 3F:
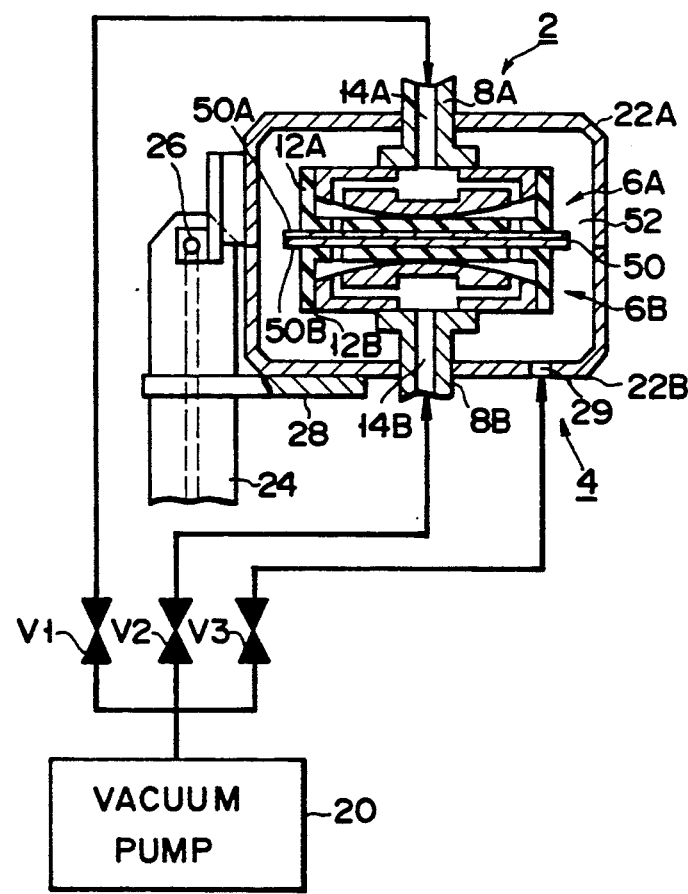

As illustrated in FIG. 3F, valves V1 to V3 are closed to restore the pressure in the exhaust paths and in chamber 52 to the air pressure. Support 2 is then unfolded from support 4, and first cover 22A is detached from cover 22B to take out bonded wafer 50.

The method of bonding the wafers according to the first embodiment of the present invention has the process mentioned above.

According to the above-described bonding method, since two wafers 50A and 50B are bonded after they are wraped, it is difficult for air bubbles to form therebetween. Also, since the wafers are bonded in a pressure-reduced atmosphere, it is harder for air bubbles to form. Even though waviness occurs on support bases 12A and 12B, few air bubbles are left in the junction between wafers 50A and 50B. Even though air bubbles are formed, the pressure in the bubbles is a reduced pressure of about 450 mmHg. Thus, the air bubbles are thus crushed by air under the atmospheric pressure (about 760 mmHg). A solid bonded wafer can, therefore, be produced without leaving any air bubbles therein.

According to the bonding apparatus of the present invention, first and second covers 22A and 22B surround wafer holders 6A and 6B, respectively, in order to create the pressure-reduced atmosphere. One of the covers is folded down onto the other cover, together with the wafer holder, thereby forming closed chamber 52 in which wafer holders 6A and 6B are housed. The volume of chamber 52 is smaller than that of a bell jar for housing the bonding apparatus itself. The time required for reducing the pressure can thus be shortened.

As described above, according to the present invention, a great number of solid bonded wafers can be manufactured in a short time.

Embodiment 2

Figure 4:
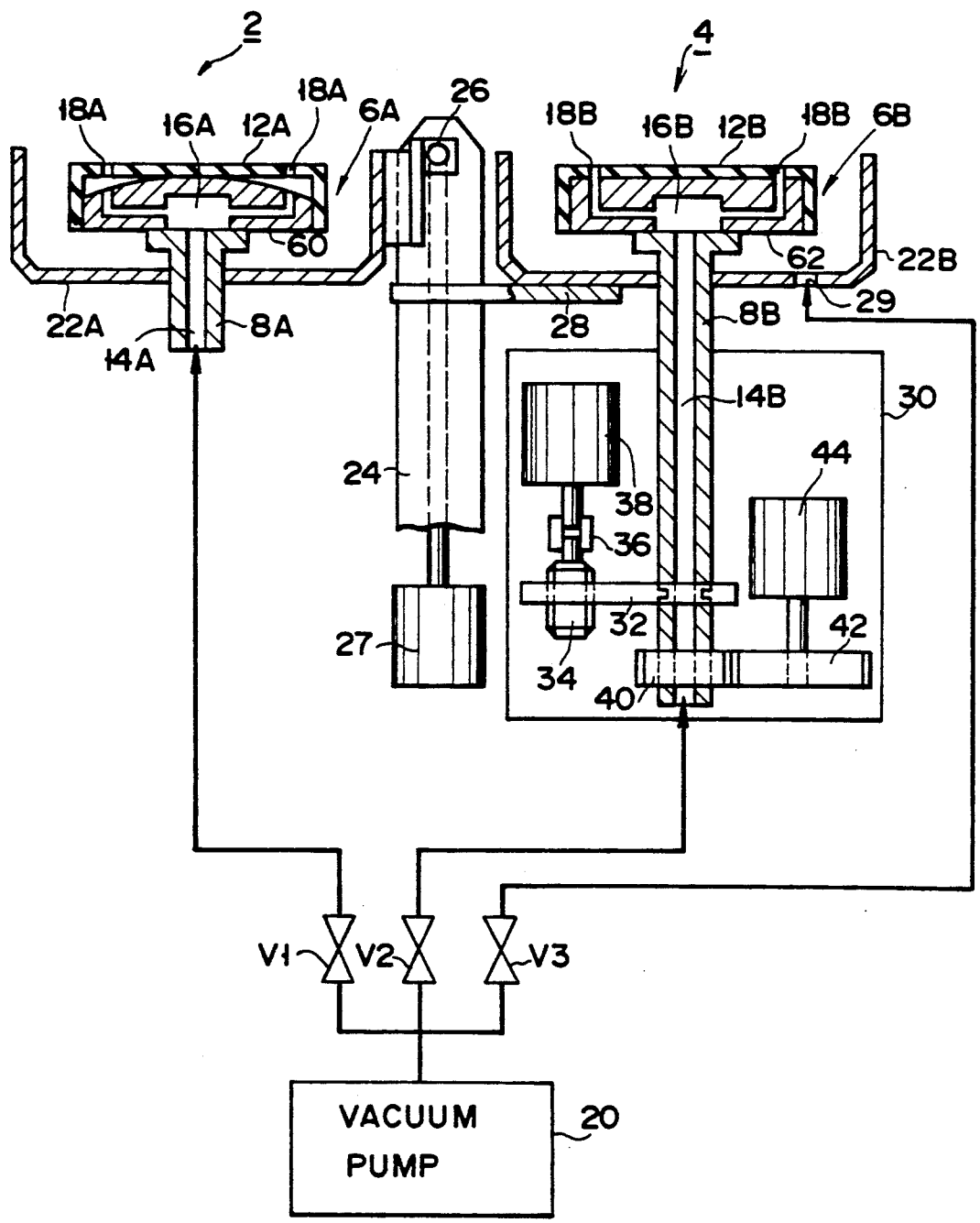
FIG. 4 is a partially sectional view showing an apparatus for bonding semiconductor wafers according to the second embodiment of the present invention.
Figure 5A:
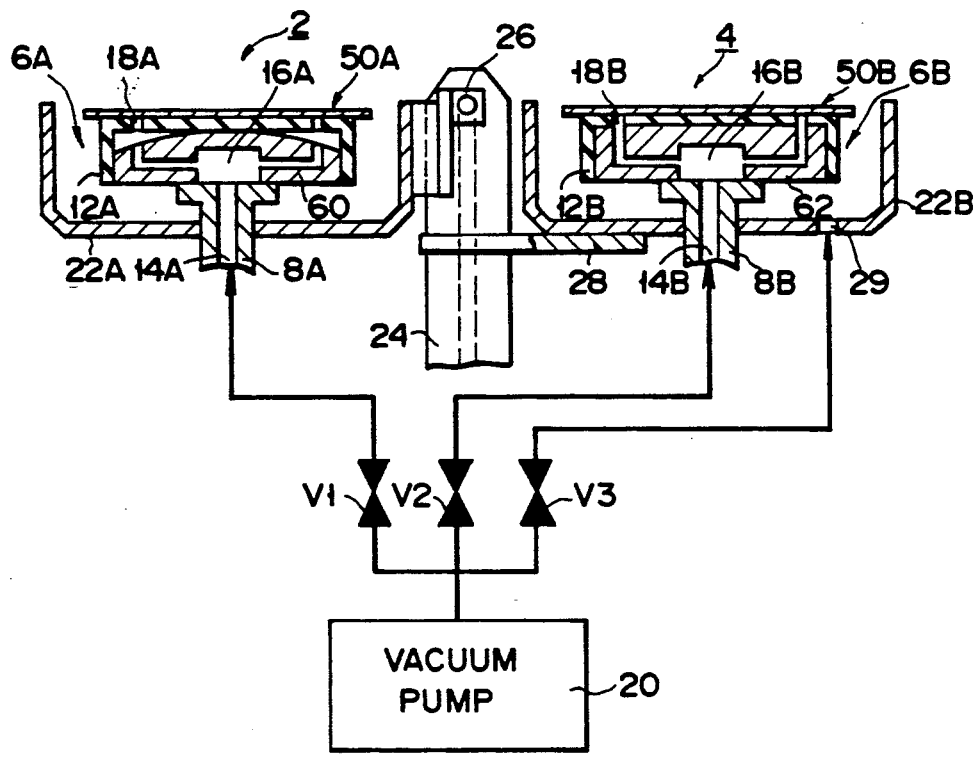
Figure 5B:
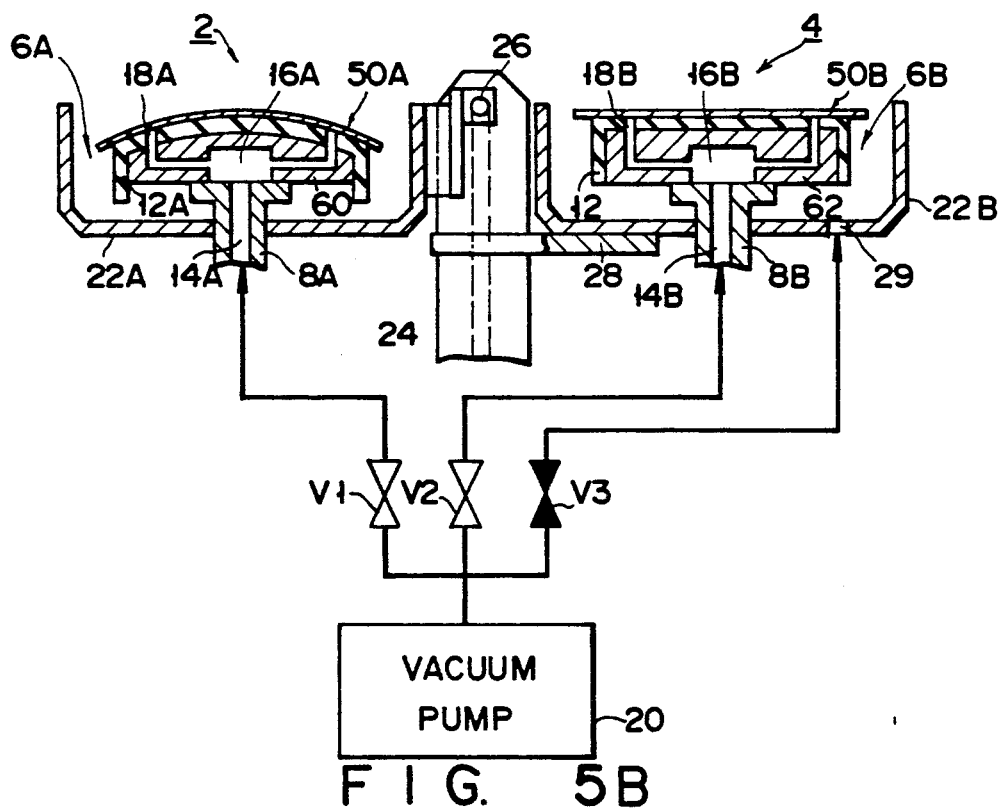
Figures 5E, 5F:
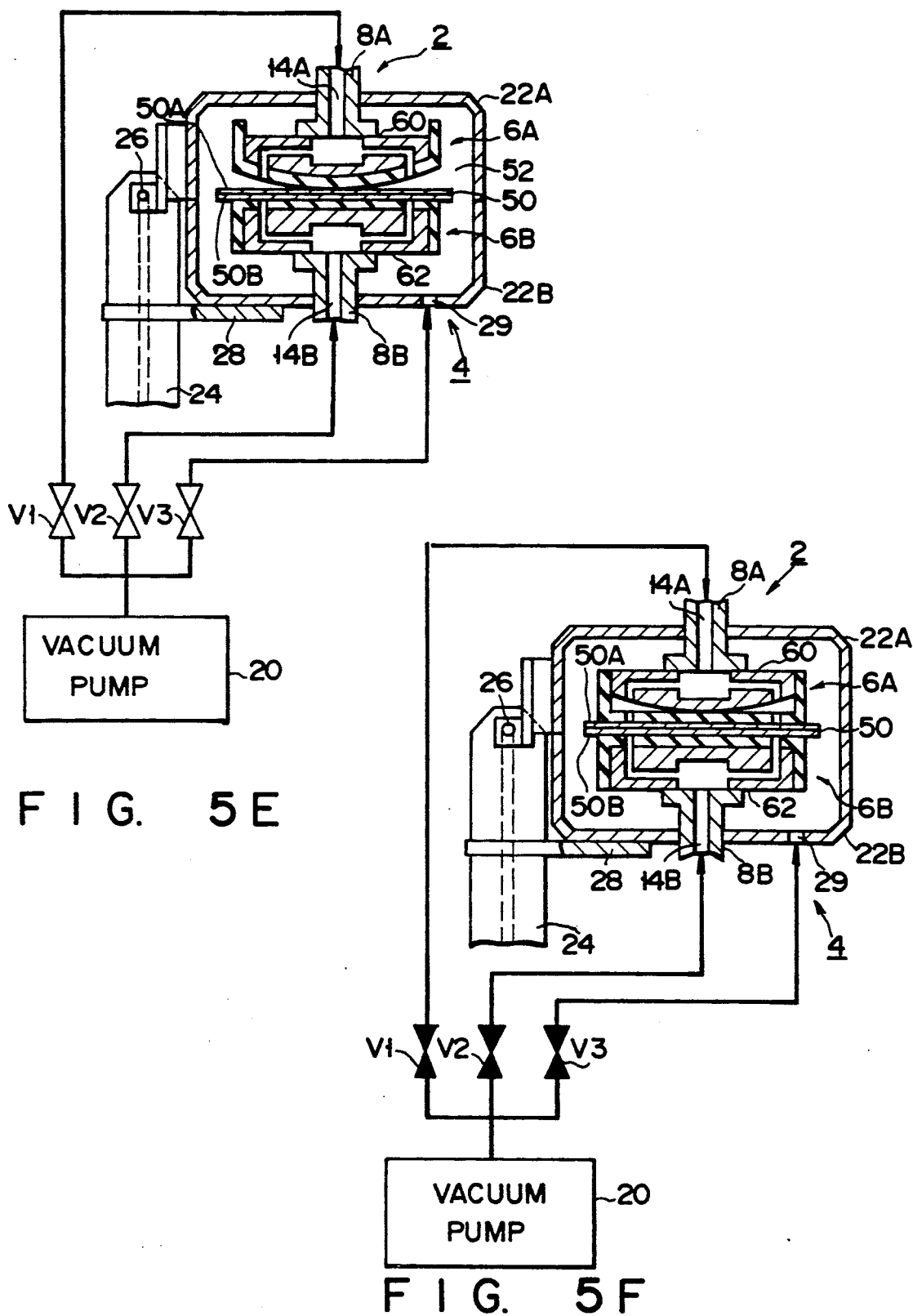

FIG. 4 is a partially sectional view showing an apparatus for bonding semiconductor wafers according to the second embodiment of the present invention. In FIG. 4, the descriptions of the elements denoted by the same numerals as those in FIG. 2 are omitted.

In the bonding apparatus according to the second embodiment, the main surface of one of projecting members constituting wafer holders 6A and 6B is flattened. In FIG. 4, the main surface of projecting member 60 constituting wafer holder 6A is formed so as to have a convex shape, and the main surface of projecting member 62 constituting wafer holder 6B is flattened. At least one of the wafer holders may be so formed that a wafer is warped.

FIGS. 5A to 5F show a process for bonding wafers by the bonding apparatus according to the second embodiment of the present invention. The bonding process is virtually the same as that of the first embodiment. In FIGS. 5A to 5F, the descriptions of the elements denoted by the same numerals as those in FIGS. 3A to 3F are omitted.

Embodiment 3

Figure 6:
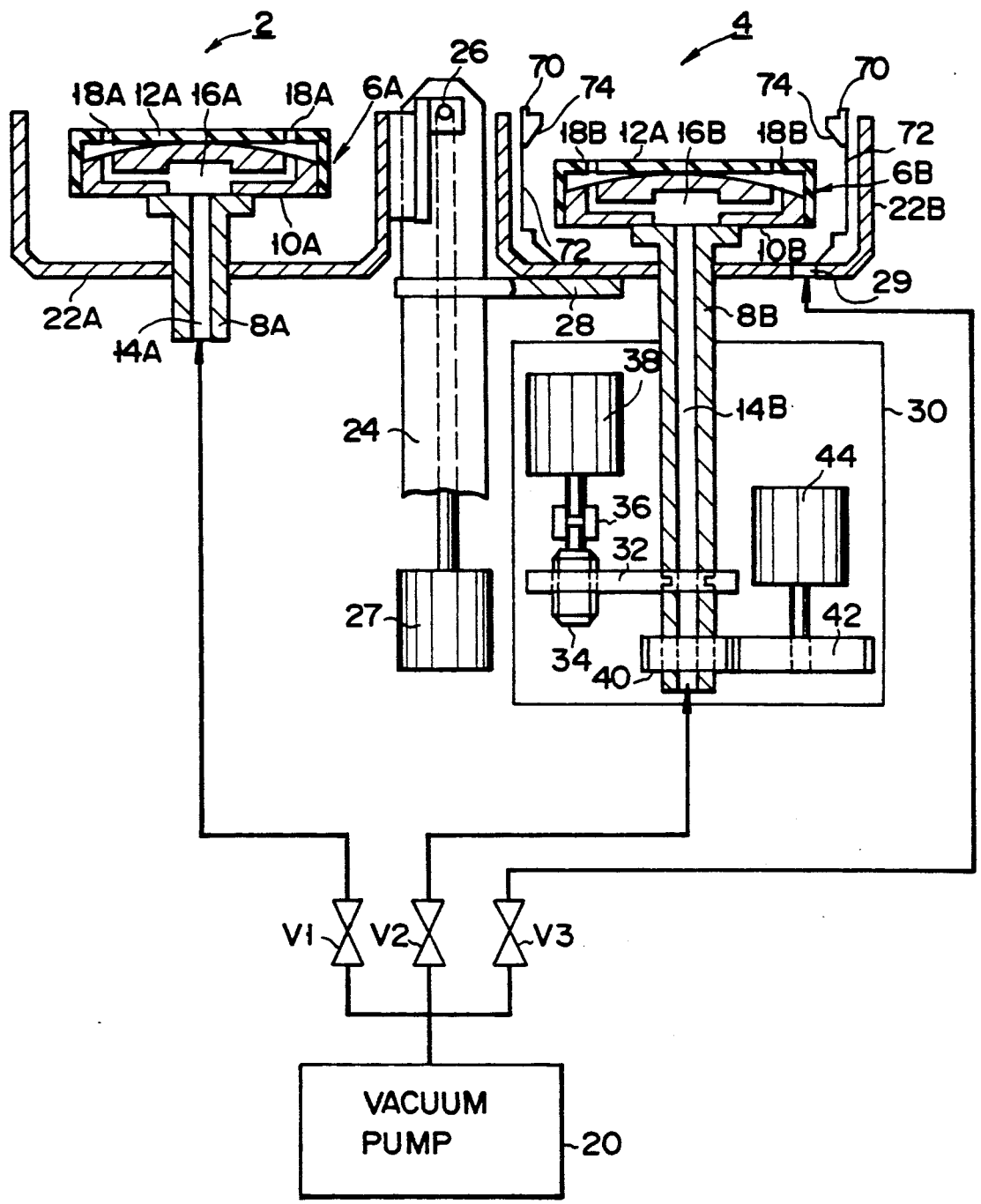
FIG. 6 is a partially sectional view showing an apparatus for bonding semiconductor wafers according to the third embodiment of the present invention.

FIG. 6 is a partially sectional view showing an apparatus for bonding semiconductor wafers according to the third embodiment of the present invention. In FIG. 6, the descriptions of the elements denoted by the same numerals as those in FIG. 2 are omitted.

As illustrated in FIG. 6, in the bonding apparatus according to the third embodiment, holding member 70 for holding a wafer is attached to second cover 22B so that three wafers can be bonded to one another. Holding member 70 is supported by flat spring 72 and fixed to second cover 22B. Surface 74 of holding member 70, which opposes wafer holder 6B, has a taper. When a wafer placed on wafer holder 6B is restored to an original flat state, surface 74 is pushed and then holding member 70 supported by flat spring 72 is opened outward. An interval between holding members 70 can thus be extended.

A method for bonding wafers using the bonding apparatus according to the third embodiment will be described with reference to FIGS. 7A to 7F. In FIGS. 7A to 7F, the descriptions of the elements denoted by the same numerals as those in FIGS. 3A to 3F are omitted.

As shown in FIG. 7A, semiconductor wafers 50A, 50B and 50C are placed on wafer holders 6A and 6B and holding member 70, respectively, in a sufficiently clean atmosphere.

As shown in FIG. 7B, valves V1 and V2 are opened to reduce the pressure in the exhaust paths to about 450 mmHg and to vacuum-chuck wafers 50A and 50B.

Figures 7C, 7D:
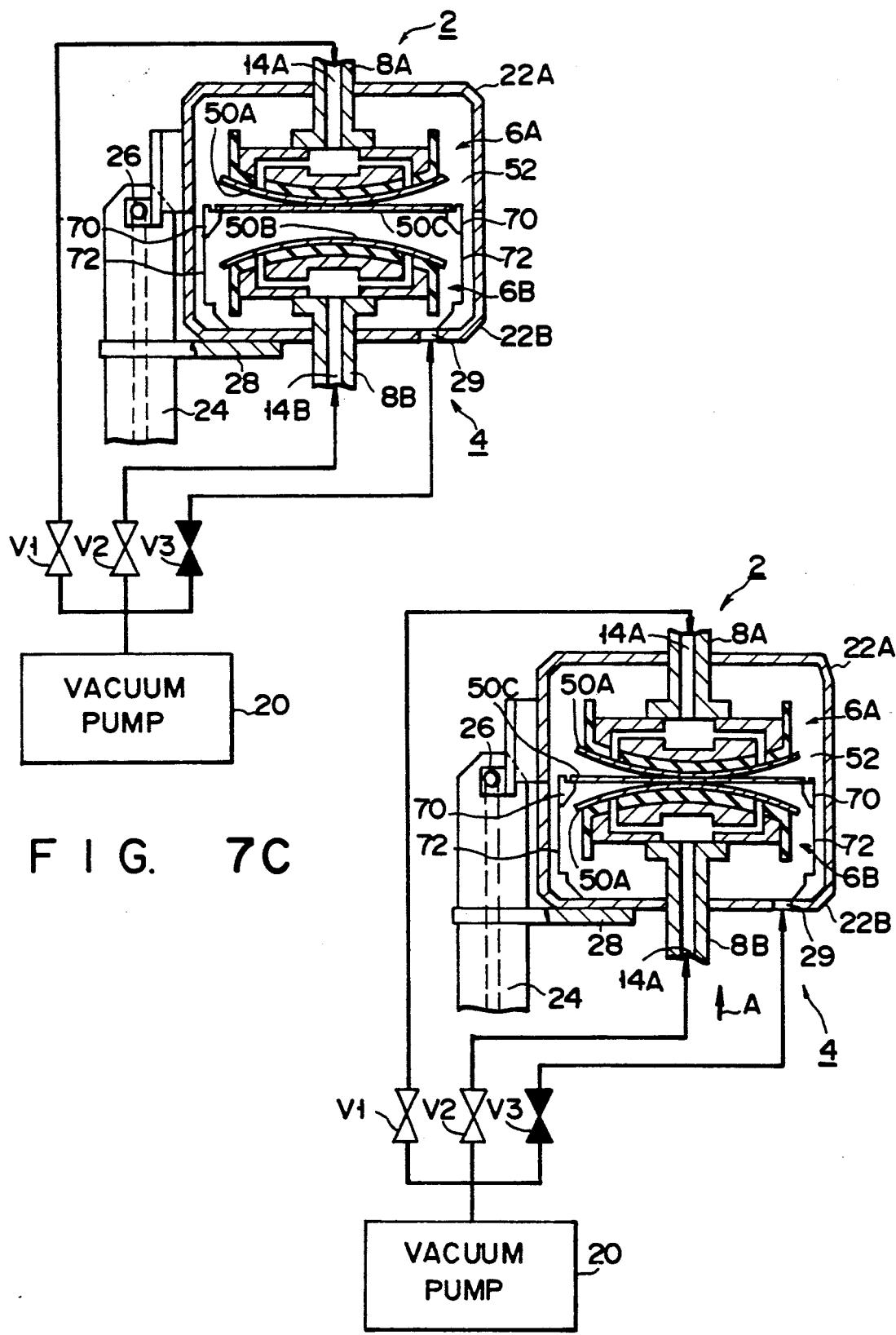

As illustrated in FIG. 7C, support 2 is folded down onto support 4. First covers 22A and 22B are then connected to each other to constitute closed chamber 52. Wafers 50A, 50B and 50C as well as wafer holders 6A and 6B are housed in chamber 52.

The height of holding member 70 from the bottom of second cover 22B or the height of wafer holder 6A from the bottom of first cover 22A is adjusted beforehand in order that wafer 50A contacts or is close to wafer 50C placed on holding member 70 when support 2 is folded.

As illustrated in FIG. 7D, wafer holder 6B is raised by the drive mechanism in the direction of arrow A to bring wafers 50A, 50B and 50C into contact with one another. It is preferable that these three wafers contact one another at their central portions.

Figures 7E, 7F:
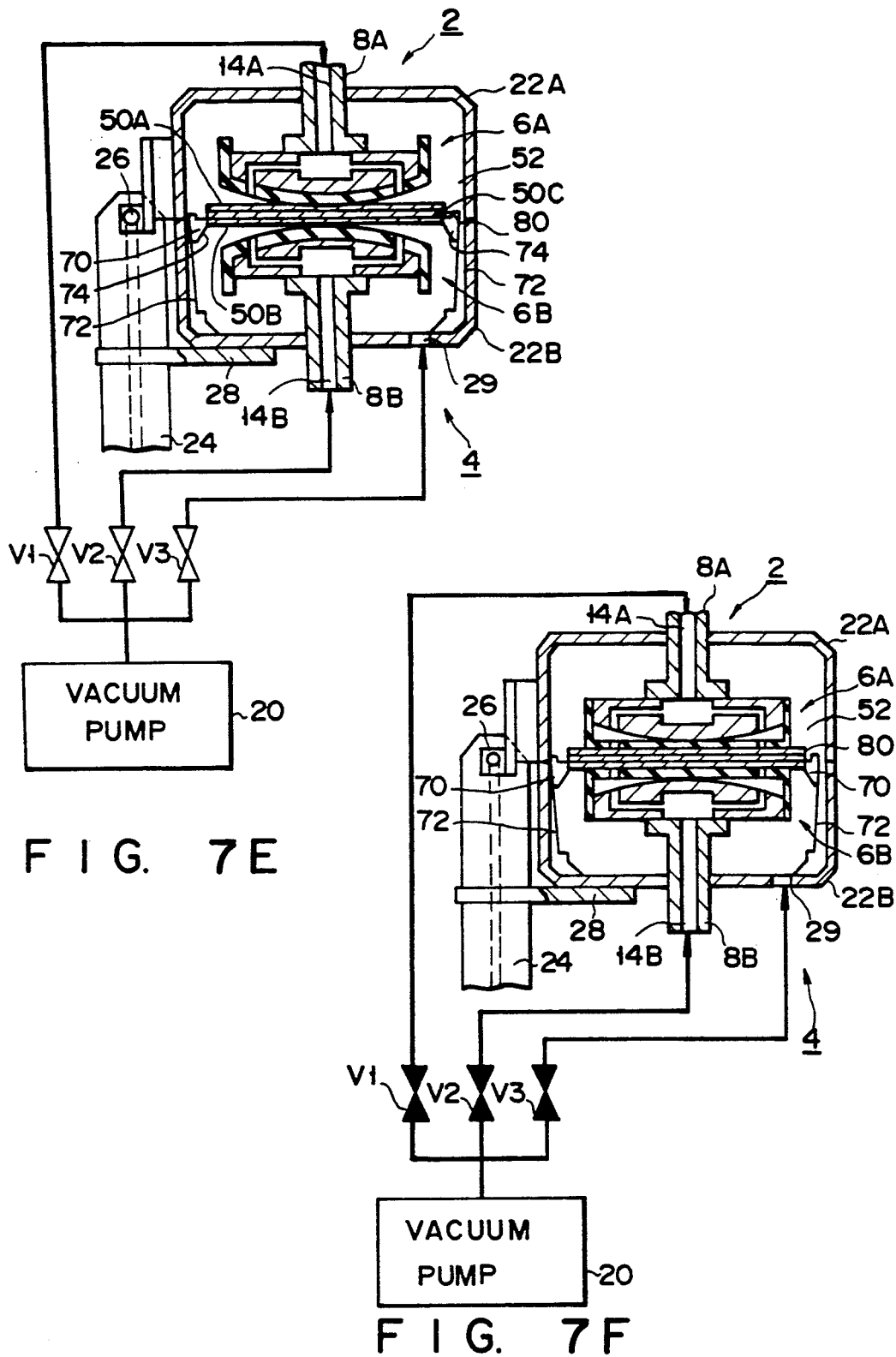

As shown in FIG. 7E, valve V3 is opened to reduce the pressure in chamber 52. The shapes of wafers 50A and 50B are thus restored and three wafers 50A, 50B and 50C contact one another, thereby forming three-layered wafer 80.

When the shape of wafer 50A is restored, the periphery of the wafer pushes tapered surface 74 of holding member 70, and, thus, holding member 70 supported by flat spring 72 is pushed outside. The interval between two holding members 70 is equal to the length of wafer 50A. The size of wafer 50C placed on holding member 70 can be set equal to that of wafer 50A. It is, therefore, possible to form three-layered wafer 80 by bonding three wafers having the same size.

As illustrated in FIG. 7F, valves V1, V2 and V3 are closed to restore the pressure in the exhaust paths and chamber 52 to air pressure.

Support 2 is unfolded and first cover 22A is detached from cover 22B to take out three-layered wafer 80.

As described above, three wafers are bonded using the bonding apparatus according to the third embodiment of the present invention.

Since both of the two wafer holders are formed so as to warp the wafers, the wafers can be bonded to one another by attaching holding member 70 to one of covers 22A and 22B.

Embodiment 4

Figure 8:
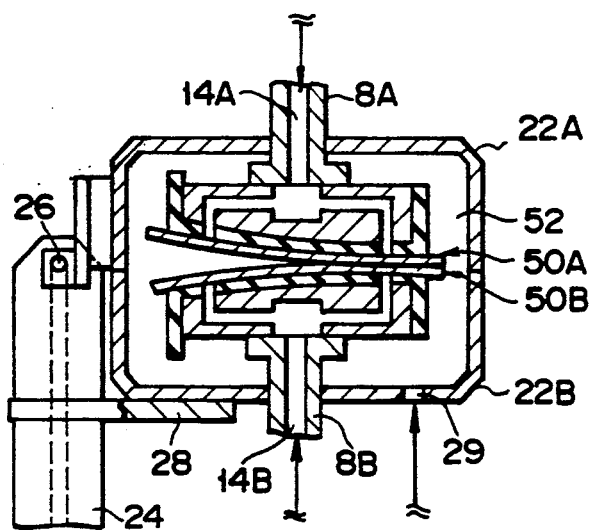
FIGS. 8 to 10 are cross-sectional views showing other cases where wafers are bonded by the bonding apparatuses according to the first to third embodiments of the present invention.
Figure 9:
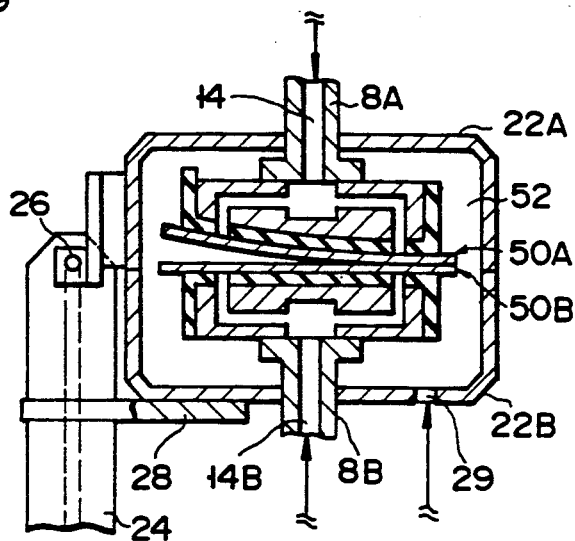
Figure 10:
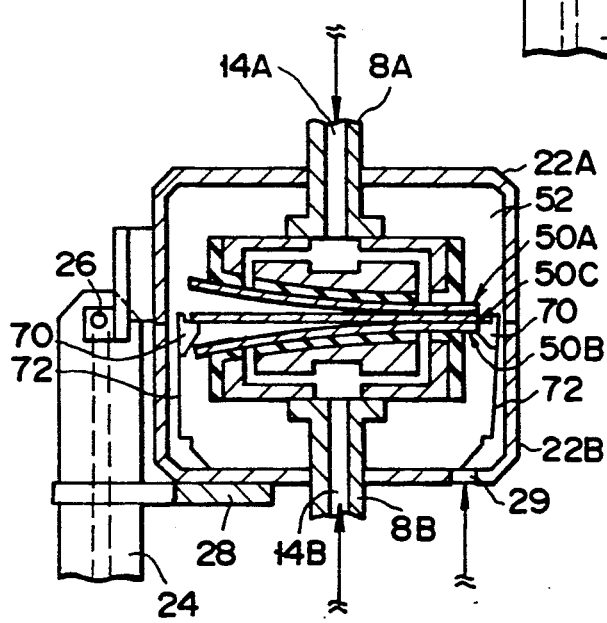

FIGS. 8 to 10 are cross-sectional views showing other cases where wafers are bonded by the bonding apparatuses according to the first to third embodiments of the present invention. In FIGS. 8 to 10, the descriptions of the elements denoted by the same numerals as those in FIGS. 3D, 5D and 7D are omitted.

As illustrated in FIG. 8, in the bonding apparatus shown in FIG. 2, wafers 50A and 50B make contact at their peripheries. Wafers 50A and 50B can be restored from this state to a flat state to manufacture a bonded wafer.

As illustrated in FIG. 9, in the bonding apparatus shown in FIG. 4, wafers 50A and 50B make contact at their peripheries.

As illustrated in FIG. 10, in the bonding apparatus shown in FIG. 6, wafers 50A, 50B and 50C make contact at their peripheries.

As described above, the contact portion of the wafers to be bonded is not limited to the middle thereof. The wafers can be bonded at any portions.

Additional advantages and modifications will readily occur to those skilled in the art. Therefore, the invention in its broader aspects is not limited to &he specific details, representative devices, and illustrated examples shown and described herein. Accordingly, various modifications may be made without departing from the spirit or scope of the general inventive concept as defined by the appended claims and their equivalents.

What is claimed is:

1. A method for bonding semiconductor substrates, comprising the steps of:
    warping a flat first semiconductor substrate under an atmospheric pressure;
    brining said warped first semiconductor substrate into contact with a second semiconductor substrate at one contact point under said atmospheric pressure; and reducing pressure from said atmospheric pressure surrounding said first and second semiconductor substrates to flatten said warped first semiconductor substrate.

2. The method according to claim 1, wherein said second semiconductor substrate is flat.

3. The method according to claim 1, wherein said second semiconductor substrate is warped.

4. The method according to claim 1, wherein said one contact point is in the middle of each of said first and second semiconductor substrates.

5. A method of bonding semiconductor wafers, comprising the steps of:
 preparing at least a first semiconductor wafer and a second semiconductor wafer, each having a main surface;
 warping at least one of said first and second semiconductor wafers, such that the main surface of said at least one semiconductor wafer is made convex;
 placing said first and second semiconductor wafers against each other under an atmospheric pressure so that a point of said main surface of said first semiconductor wafer contacts a point on said main surface of said second semiconductor wafer;
 reducing pressure form said atmospheric pressure in which said first and second semiconductor wafers are placed;
 flattening said at least one semiconductor wafer by virtue of the reduced pressure; and
 bonding said first and second semiconductor wafers to each other by bringing the entire main surface of each of said first and second semiconductor wafers into contact with each other.

6. A method of bonding semiconductor wafers, comprising the steps of:
 preparing a first semiconductor wafer and a second semiconductor wafer, each having a main surface;
 warping at least one of said first and second semiconductor wafers, such that at least a portion of the main surface of said at least one semiconductor wafer is made convex;
 placing said first and second semiconductor wafers against each other under an atmospheric pressure so that there exists a point of contact and a space between the wafers;
 eliminating the space between the wafers by reducing pressure from said atmospheric pressure in which the wafers are placed, thereby flattening said at least one semiconductor wafer; and
 bonding said first and second semiconductor wafers to each other by brining the entire main surface of each of said first and second semiconductor wafers into contact with each other.

7. A method as set forth in claim 5 wherein the step of warping includes warping both said first and second semiconductor wafers.

8. A method for bonding semiconductor substrate, comprising the steps of:
 warping a flat first semiconductor substrate and a flat second semiconductor substrate under an atmospheric pressure;
 bringing said warped first semiconductor substrate into contact with a third semiconductor substrate at a first contact point and bringing said warped second semiconductor substrate into contact with said third semiconductor substrate at a second contact point under said atmospheric pressure;
 reducing pressure from said atmospheric pressure surrounding said first, second and third semiconductor substrates to flatten said warped first semiconductor substrate and said warped second semiconductor substrate.

9. The method according to claim 8, wherein said third semiconductor substrate is flat.

10. The method according to claim 8, wherein said first contact point is in the middle of each of said first and third semiconductor substrates and said second contact point is in the middle of each of said second and third semiconductor substrates.

11. A method of bonding semiconductor wafers, comprising the steps of:
 preparing at least a first semiconductor wafer, a second semiconductor wafer and a third semiconductor wafer, each having a first and second main surface;
 warping said first and second semiconductor wafers, such that the first main surface of said first semiconductor wafer is made convex and such that the second main surface of said second semiconductor wafer is made convex;
 placing said first and third semiconductor wafers against each other under an atmospheric pressure so that a point on said first main surface of said first semiconductor wafer contacts a point on said second main surface of said third semiconductor wafer and placing said second and third semiconductor wafers against each other so that a point on said second main surface of said second semiconductor wafer contacts a point on said first main surface of said third semiconductor wafer;
 reducing pressure from said atmospheric pressure in which said first, second and third semiconductor wafers are placed;
 flattening said warped semiconductor wafers by virtue of the reduced pressure; and
 bonding said first and third semiconductor wafers to each other by brining the entire first main surface of said first semiconductor wafer and the entire second main surface of said third semiconductor wafer into contact with each other and bonding said second and third semiconductor wafers to each other by brining the entire second main surface of said second semiconductor wafer and the entire first main surface of said third semiconductor wafer into contact with each other.

12. A method of bonding semiconductor wafers, comprising the steps of:
 preparing a first semiconductor wafer, a second semiconductor wafer and a third semiconductor wafer, each having a first and second main surface;
 warping said first and second semiconductor wafers, such that at least a portion of the first main surface of said first warped semiconductor wafer is made convex and such that at least a portion of the second main surface of said second semiconductor wafer is made convex;
 placing said first and third semiconductor wafers against each other under an atmospheric pressure so that a point of contact and a space exists between the first and third wafers and placing said second and third semiconductor wafers against each other so that a point of contact and a space exists between the second and third wafers;

eliminating the spaces between the wafers by reducing pressure from said atmospheric pressure in which the wafers are placed, thereby flattening said first and second semiconductor wafers; and bonding said first and third semiconductor wafers to each other by brining the entire first main surface of said first semiconductor wafer and the entire second main surface of said third semiconductor wafer into contact with each other and bonding said second and third semiconductor wafers to each other by brining the entire second surface of said second semiconductor wafer and the entire first main surface of said third semiconductor wafer into contact with each other.

* * * * *